United States Patent [19]

Ash et al.

[11] Patent Number: 5,045,896
[45] Date of Patent: Sep. 3, 1991

[54] SOLID STATE LIGHT SOURCE FOR EMITTING LIGHT OVER A BROAD SPECTRAL BAND

[75] Inventors: Richard M. Ash, Northampton; Andrew Carter, Northants, both of England

[73] Assignee: Siemens Plessey Controls Limited, Dorset, England

[21] Appl. No.: 326,555

[22] Filed: Mar. 21, 1989

[51] Int. Cl.$^5$ ............................................. H01L 33/00
[52] U.S. Cl. .......................................... 357/17; 357/4; 357/16; 372/43; 372/44; 372/45
[58] Field of Search ................... 357/16, 17, 90, 30 B, 357/30 E, 4, 30 L; 372/43, 44, 45

[56] References Cited

U.S. PATENT DOCUMENTS

| | | | |
|---|---|---|---|
| 3,852,591 | 12/1974 | Lee et al. | 357/17 |
| 4,378,259 | 3/1983 | Hasegawa et al. | 357/16 |
| 4,383,269 | 5/1983 | Capasso | 357/90 |
| 4,476,477 | 10/1984 | Capasso et al. | 357/16 |
| 4,694,318 | 9/1987 | Capasso et al. | 357/90 |
| 4,817,110 | 3/1989 | Tokuda et al. | 372/45 |
| 4,860,069 | 8/1989 | Yamazaki | 357/17 |
| 4,864,369 | 9/1989 | Snyder et al. | 357/16 |
| 4,887,134 | 12/1989 | Saito et al. | 357/16 |

FOREIGN PATENT DOCUMENTS 58-197784 11/1983 Japan ..................................... 357/17

OTHER PUBLICATIONS

Capasso et al., "The Superlattice Photodetector . . . Rates Ratio", IEEE, pp. 284–287, 1981.
Judd et al., "Observation of Discrete . . . Low Temperatures", Appl. Phys. Lett. 49(24), 12/86.

*Primary Examiner*—Rolf Hille
*Assistant Examiner*—Minhloan Tran
*Attorney, Agent, or Firm*—Fleit, Jacobson, Cohn, Price, Holman & Stern

[57] ABSTRACT

A solid state light source comprising a monolithic light emitter diode structure having a graded bandgap active region 8 the thickness of which is graded between two materials 9, 11, the said materials having differing center wavelengths of light emission, such that the source is capable of emitting light at wavelengths L1, L2 spaced over the whole spectral width between the wavelengths exhibited by the said two materials. This can enable the light source to be used in optical fibre devices where it can provide on alternative to the filament lamp source and thus give an increased reliability in use.

5 Claims, 2 Drawing Sheets

SOLID STATE LIGHT SOURCE FOR EMITTING LIGHT OVER A BROAD SPECTRAL BAND

BACKGROUND OF THE INVENTION

This invention relates to a solid state light source. It relates particularly to such a light source which is capable of emitting light over a broad spectral band.

In the construction of optical fibre devices which make use of a spectral filtering technique, it is usual to employ tungsten-halogen incandescent filament lamps in order to provide the broad spectral emission width that is necessary. Unfortunately, the filament lamp is a somewhat fragile article and this characteristic makes it unreliable in operation. The need to include such a lamp is likely to cause eventual breakdown of the complete fibre device particularly when this is used under the severe conditions of operation that are sometimes necessary. The degree of ruggedness and reliability that would be desirable in the lamp part can be found in the light emitter diode construction but these devices have inherently a rather narrow spectral emission width (typically 40 nanometers at a wavelength of 900 nanometers) so that a single conventional LED would be incapable of providing the bandwidth required.

One object of the present invention is to provide a solid state light source that will be capable of emitting light over a broad spectral band and which will be reliable in operation.

SUMMARY OF THE INVENTION

According to the invention, there is provided a solid state light source for generating light in the range of visible and infra-red radiation by the recombination of charge carriers comprising, a monolithic light emitter diode structure having an active region which has a bandgap which varies through the thickness of said region, the said region being formed from single crystal semiconductor materials of differing chemical composition, at least one of which materials has a direct energy bandgap, said materials having differing centre wavelengths of light emission, such that the charge carrier recombination occurs at different places through the thickness of the active region and the source is capable of emitting light at wavelengths which are spaced over a broad spectral range.

Preferably, the semiconductor material of the active region comprises at least one compound semiconductor material. The active region may have a bandgap which is narrower on one side than the other. The active region may comprise a gallium aluminium arsenide compound.

Alternatively, the active region may comprise a gallium indium arsenide phosphide compound.

The active region may include barriers arranged to control any charge carrier drift across said region.

BRIEF DESCRIPTION OF THE DRAWINGS

By way of example, some particular embodiments of the invention will now be described with reference to the accompanying drawings, in which.

DETAILED DESCRIPTION OF THE PREFERRED EMBODIMENT

Figure 1:
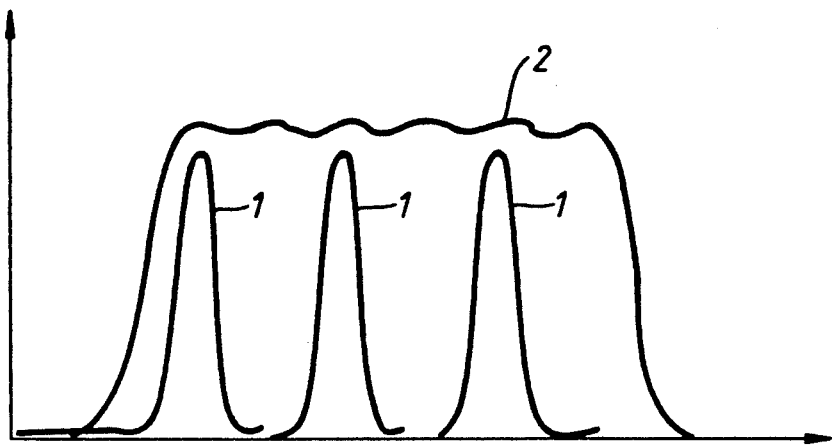
FIG. 1 is a graph showing the light wavelengths produced by some commercially available LED devices.

FIG. 1 shows schematically some typical light outputs from existing light emitter diode devices. The horizontal axis gives the wavelength of emission whilst the vertical axis measures the light intensity output. It will be seen that three existing devices have output curves 1 with very sharply defined centre wavelengths. For obtaining light outputs in a short wavelength (about 0.6 to 0.9 micrometers) part of the range the semiconductors used could be based on the GaAlAs/GaAs materials system. For obtaining light outputs in a long wavelength (above 1.0 micrometers) part of the range the InP/GaInAsP materials system would generally be used.

As already explained, the present invention was devised to provide a broad band of light emission, somewhat as depicted by the output curve 2 on FIG. 1.

Figure 2:
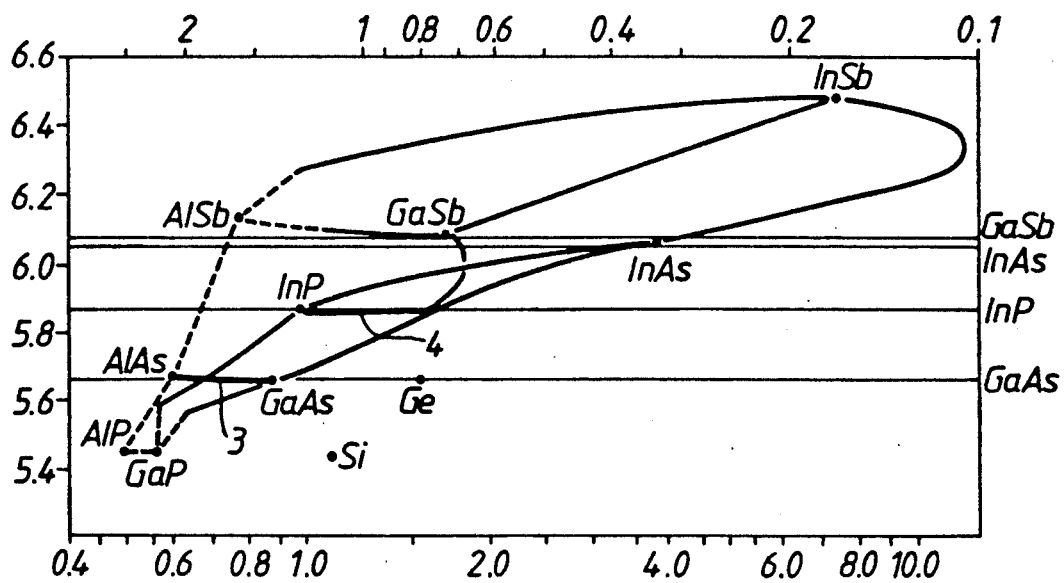
FIG. 2 is a diagram showing the energy bands and wavelengths associated with different compound semiconductor materials systems.

FIG. 2 is a diagram illustrating the useful parts of these semiconductor materials systems with the horizontal axis showing the Wavelength Corresponding to Energy Gap measured in micrometers. The vertical axis gives the Lattice Constants (in Angstrom Units) for the materials.

An upper horizontal axis shows the Energy Band (measured in electron volts), whilst at the right hand side, lines corresponding to the choice of different device substrate materials have been marked. Using a substrate of indium phosphide and GaInAsP, wavelengths between 1.0 and 1.6 micrometers could be expected. Similarly, using a substrate of gallium arsenide and GaAlAs, wavelengths between 0.6 and 0.9 micrometers should be attainable. This illustration thus confirms the figures for possible wavelength ranges already given.

A first horizontal line portion 3 highlights the properties of GaAlAs/GaAs whilst a second horizontal line portion 4 depicts those for GaInAsP/InP.

Figure 3:
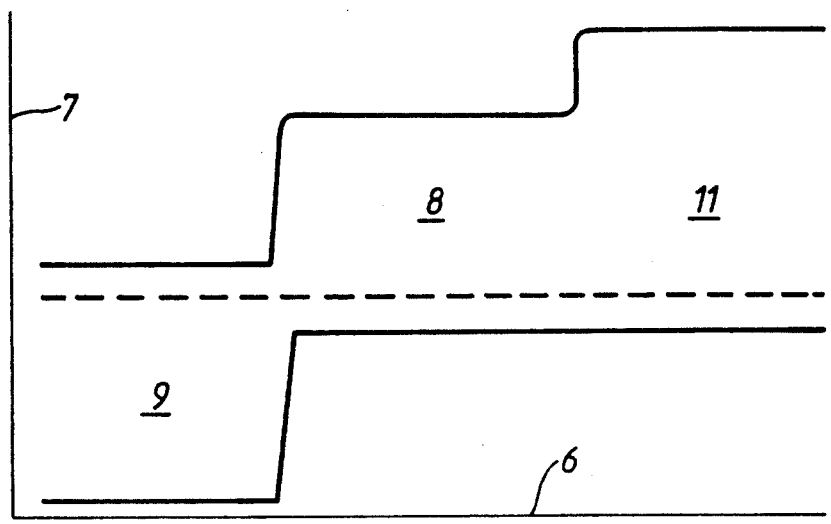
FIG. 3 is a schematic band diagram of a standard light emitter diode structure.

FIG. 3 is a schematic band diagram of a conventional gallium arsenide/gallium aluminium arsenide light emitter diode construction. The diagram shows on the horizontal axis 6 the distance (by which the thickness of the active region is measured) and on a vertical axis 7 the electron energy, a greater distance from the origin indicating a higher level of energy of the electrons. Conversely, for holes present in the diagram, a hole nearer the origin will have a higher level of energy than one further from the origin.

In FIG. 3, a very thin active region 8 of semiconductor material is sandwiched between cladding layers 9 and 11 of wider bandgap semiconductor material. The layer 9 is of n-gallium aluminium arsenide whilst the layer 11 is of the same chemical composition but of the p-conductivity type. The sandwiched region 8 is also of p-gallium aluminium arsenide.

In operation, electrons are injected from the wide bandgap cladding layer 9 into the p-type active region 8. Similarly, holes are injected from the cladding layer 11 into the active region 8. The recombination of the electrons and holes occurs in the region 8 and this causes the emission of light. For the construction depicted in FIG. 3, the light is emitted at substantially a single wavelength and this would therefore produce a single one of the output curves 1 of FIG. 1. The energy dimension of the bandgap thus has a single value in the conventional light emitter diode construction.

Figure 4:
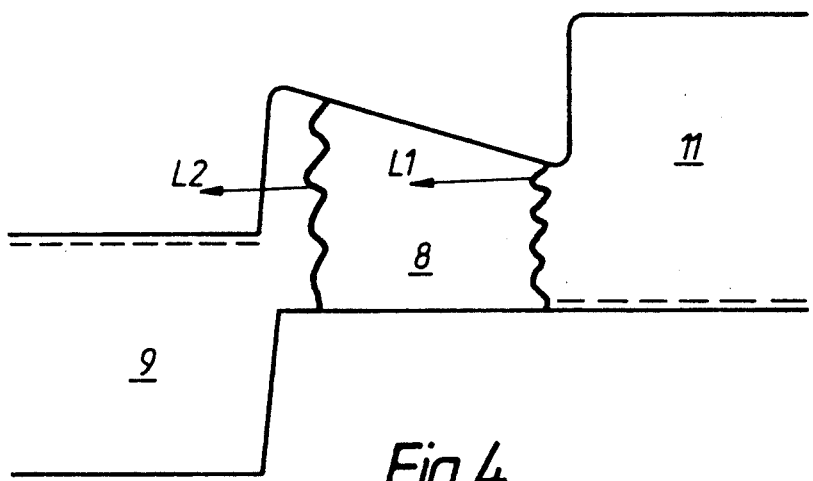
FIGS. 4 and 5 are schematic band diagrams of modified diode structures having graded active regions.

In the present invention, the energy of the bandgap is graded as in the construction of FIG. 4. With this construction, the recombination of the electrons and holes will now occur with the emission of light L1 of long wavelength from the side of the gap adjacent the p-type material and of short wavelength light L2 from the side of the gap adjacent the n-type material. Intermediate wavelengths of light are also produced as a result of the recombinations which occur at different points along the thickness of the gap.

A possible problem that might occur with this simple structure is that the substantial built-in field due to the grading could cause all the carriers to rapidly drift to the narrow bandgap region of the active layer, thus enhancing the emission at this wavelength.

Figure 5:
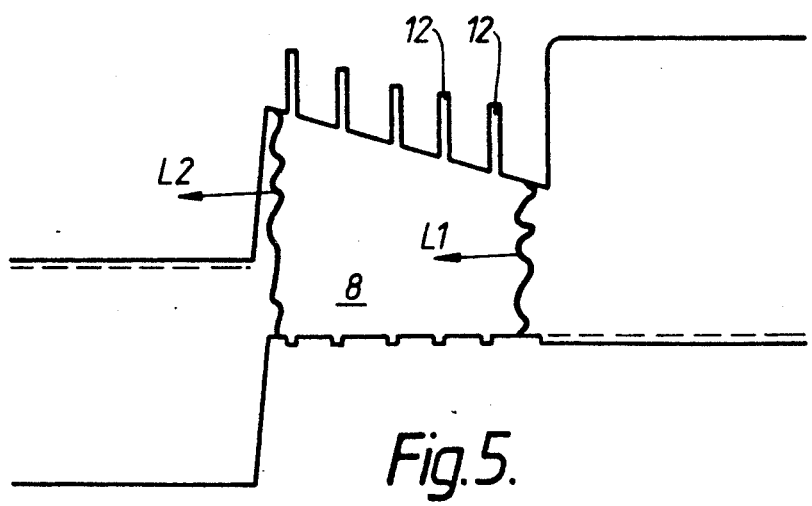

FIG. 5 depicts an alternative construction that was devised to assist in reducing this effect. This construction incorporates "barriers" 12 within the active region which are intended to retard the carrier drift.

These barriers 12 were formed conveniently of p-type gallium aluminium arsenide and were designed to control tunnelling and thermal emission over the operating temperature range of the device.

The construction of the solid state light source begins with growth of the required semiconductor material which could be by metal organic chemical vapour deposition (MOCVD) or by molecular beam epitaxy (MBE).

In MOCVD, gases such as trimethyl gallium, trimethyl indium, trimethyl aluminium, arsine and phosphine are reacted at atmospheric or low pressure on a heated substrate of gallium arsenide or indium phosphide. P- or n-type dopant materials are incorporated by including dimethyl zinc, hydrogen sulphide, hydrogen selenide or other reagents in the gas stream.

In MBE, elements or compounds containing the required elements are heated in a high vacuum system and impinge upon a heated gallium arsenide or indium phosphide substrate to grow the layers required. Dopants are incorporated by introducing them into the system in the same way. Gaseous sources may also be used to provide the reagents.

After the growth of the required semiconductor material, the diode may then be fabricated using standard semiconductor processing techniques such as the following:

1. Confinement of current to a particular region by dielectric isolation, implantation, diffusion or the growth of burying or current blocking semiconductor regions.

2. Ohmic contact fabrication using diffusion, ion implantation or metallization using titanium, zinc, gold, indium, germanium, platinum, chromium, tungsten, cadmium or other suitable metals deposited by evaporation, sputtering or selective growth.

3. Contact alloying at elevated temperatures.

4. Thinning of wafers by mechanical, chemical or other techniques.

5. Etching of semiconductors using chemical reagents, ion beam milling, reactive ion etching or plasma etching.

Calculation of the required barrier heights and thickness is carried out using quantum mechanical calculations of tunnelling currents through barriers.

The foregoing descriptions of embodiments of the invention have been given by way of example only and a number of modifications may be made without departing from the scope of the invention as defined in the appended claims. For instance, it is not essential that the device construction should be based on the gallium arsenide/gallium aluminium arsenide system. This is capable of giving broadband light emission only over a particular wavelength range. For a different band of emission, alternative materials would be required and a possible choice would be indium phosphide with gallium indium arsenide phosphide. Instead of the barriers specifically described, some alternative means for slowing the charge carrier drift could of course be used.

We claim:

1. A broad band emitting semiconductor source of incoherent light, the source comprising a monolithic structure having an active semiconductor region located between cladding layers of a wide energy bandgap compound, said active region being formed of single crystal semiconductor materials selected from a group consisting of compounds of aluminum, arsenic, gallium, indium and phosphorus, and having a graded bandgap which varies through a thickness thereto, with the single crystal semiconductor materials having differing chemical composition and differeing center wavelengths of light emission, at least one of said materials having a direct energy bandgap, such that, in operation, a charge carrier recombination will occur at different places throughout the thickness of the active region thus causing a light emission at wavelengths which are spaced over a broad spectral range.

2. A light source as claimed in claim 1, in which the said active region has a bandgap which is narrower on a first side than on a second side.

3. A light source as claimed in claim 1, in which the active region comprises a gallium aluminium arsenide compound.

4. A light source as claimed in claim 1, in which the active region comprises a gallium indium arsenide phosphide compound.

5. A light source as claimed in claim 1, in which the active region included barriers which are arranged and formed in a manner which controls any drift of charge carriers along the thickness of said region.

* * * * *